US009075086B2

(12) United States Patent
Seveau et al.

(10) Patent No.: US 9,075,086 B2
(45) Date of Patent: Jul. 7, 2015

(54) METHOD AND APPARATUS FOR DETERMINING TIME-VARYING LIMITATIONS OF A POWER SOURCE

(71) Applicant: Sierra Wireless, Inc., Richmond (CA)

(72) Inventors: Christophe Seveau, Sai Kung (HK); Lik King Au-Yeung, Tsuen Wan (HK)

(73) Assignee: Sierra Wireless, Inc., Richmond, British Columbia (CA)

( * ) Notice: Subject to any disclaimer, the term of this patent is extended or adjusted under 35 U.S.C. 154(b) by 41 days.

(21) Appl. No.: 13/901,838

(22) Filed: May 24, 2013

(65) Prior Publication Data

US 2014/0347100 A1   Nov. 27, 2014

(51) Int. Cl.
*H03K 5/22* (2006.01)
*G01R 19/00* (2006.01)
*G06F 1/26* (2006.01)

(52) U.S. Cl.
CPC .............. *G01R 19/0038* (2013.01); *G06F 1/26* (2013.01)

(58) Field of Classification Search
CPC ......... H03K 5/22; H03K 5/24; H03K 5/2418; H03K 5/2481; G01R 19/0038; G06F 1/26
USPC .............................................. 327/50, 63, 64
See application file for complete search history.

(56) References Cited

U.S. PATENT DOCUMENTS

| 5,898,238 | A | 4/1999 | Dombrowski |
| 6,624,667 | B2 * | 9/2003 | Nii .................................. 327/77 |
| 7,688,074 | B2 | 3/2010 | Cox et al. |
| 7,919,994 | B2 | 4/2011 | Walker et al. |

FOREIGN PATENT DOCUMENTS

WO  PCT/CA2014/050459   11/2014

OTHER PUBLICATIONS

PCT/CA2014/050459 International Search Report and Written Opinion mailed Jul. 22, 2014.
STN1110—Multiprotocol OBD Interpreter 1C Chip—Low Cost, High-Performance [online]; 2012 [retrieved on Jun. 14, 2013; URL:http//www.obdsol.com/stn1110/]; pp. 1-3.
STN11xx, PowerSave Functionality, 2010 ScanTool.net, LLC, www.ScanTool.net, pp. 1-13, 2010.

* cited by examiner

*Primary Examiner* — Hai L Nguyen
(74) *Attorney, Agent, or Firm* — Wagenknecht IP Law Group PC

(57) ABSTRACT

A low-power method and apparatus is provided for adapting to time-varying limitations of a power source, such as a vehicle power source which is in a more-limited state when the engine is off. The supply voltage is monitored for changes using an unclocked, low-power first stage having an analog section, a voltage comparator. Upon detecting voltage changes reflective of a potential power source state change, the first stage generates an interrupt. In response, a second stage transitions from a low-power standby mode to a higher-power active mode. The second stage may include a microprocessor and is configured to confirm or disconfirm the state change. Upon confirmation, further operations are triggered. Upon disconfirmation, the second stage returns to standby mode. The first stage may include an operational amplifier whose two inputs are indicative of the supply voltage, one input having a different response rate to voltage variations than the other.

14 Claims, 9 Drawing Sheets

METHOD AND APPARATUS FOR DETERMINING TIME-VARYING LIMITATIONS OF A POWER SOURCE

FIELD OF THE TECHNOLOGY

The present technology pertains in general to energy management and in particular to electronic systems which adapt to time-varying limitations in their power source, more particularly by awakening an electronic module from a standby mode when the limitations of its power source are relaxed.

BACKGROUND

Electronics products are increasingly being provided for installation in vehicles. Typically, such products draw power from the vehicle's electrical system and therefore product operation depends on the vehicle's ability to provide energy to the product. When the vehicle's engine is turned on, the alternator provides electricity with significantly less limitation than when the engine is turned off. When the engine is turned off, electricity is supplied instead via the vehicle's battery, which is significantly more limited (for example in that the battery's supply of stored energy is less than the supply of energy stored as fuel and available as electricity through operation of the vehicle's engine and alternator). Products powered by the vehicle's electrical system can therefore be made to switch to a low power mode to avoid prematurely discharging the vehicle's battery when the engine is off.

To realize this function, the device may be configured to monitor the battery voltage in order to infer the vehicle's engine status. For example, when the vehicle engine is turned off, the battery voltage may fall within a first range, for example of about 12 V. When the vehicle engine is turned on, the battery voltage may fall within a second range, for example of about 14 V. Absolute battery voltage may significantly vary around the values indicated above, depending on vehicles type and battery aging.

It is noted that monitoring of the power system also requires power, and therefore it is desired that monitoring operations should also consume low amounts of power so that they themselves do not prematurely discharge the battery. One solution is based on a dual-processor architecture as follows. When the vehicle's engine is off, a main processor is inactive or idle, and the vehicle's power system monitoring is managed by a second, lower-powered digital microprocessor. The power system voltage is sampled at a sufficient rate, for example via an analog-to-digital converter (ADC) and the lower-powered processor wakes up the main processor if the vehicle's engine is detected to turn on. However, this solution incurs the expense of an additional processor and still requires significant power in order to operate the ADC and lower-powered processor during standby.

Therefore there is a need for a method and apparatus for adapting to limitations in a power source that is not subject to one or more limitations of the prior art.

This background information is provided for the purpose of making known information believed by the applicant to be of possible relevance to the present technology. No admission is necessarily intended, nor should be construed, that any of the preceding information constitutes prior art against the present technology.

SUMMARY OF THE TECHNOLOGY

An object of the present technology is to provide a method and apparatus for facilitating adapting to time-varying limitations of a power source, such as a vehicular power source. In accordance with an aspect of the present technology, there is provided an apparatus for use in adapting to time-varying limitations of a power source, the apparatus comprising a first stage circuit including: an input terminal for operative coupling to a supply voltage provided by the power source; an analog electronics section configured to concurrently generate a first intermediate signal indicative of the supply voltage and a second intermediate signal indicative of the supply voltage, wherein the first intermediate signal responds at a first rate to variation in the supply voltage and the second intermediate signal responds at a second rate to variation in the supply voltage, the second rate different from the first rate; a comparator section configured to compare the first intermediate signal and the second intermediate signal and to output a change detect signal upon detecting at least a predetermined difference between the first intermediate signal and the second intermediate signal, said difference indicative of a possible change in limitations of the power source; an output configured to provide an output signal indicative of the change detect signal, the output signal usable for operating further circuitry in response to the possible change in limitations of the power source.

In accordance with another aspect of the present technology, there is provided an apparatus for use in adapting to time-varying limitations of a power source, the apparatus comprising: an at least partially analog first stage circuit configured to monitor a supply voltage of the power source and to generate an interrupt signal in response to a predetermined amount of change in the monitored supply voltage, said change indicative of a possible change in limitations of the power source; a second stage circuit operable in a lower-power standby mode and a higher-power active mode, the second stage circuit configured, in response to the interrupt signal, to: switch from the standby mode to the active mode; monitor the supply voltage while in the active mode; confirm or disconfirm the possible change in limitations of the power source while in the active mode; trigger further electronic operations upon confirming the possible change in limitations; and return to the lower-power standby mode upon disconfirming the possible change in limitations.

In accordance with another aspect of the present technology, there is provided a method for facilitating adapting to time-varying limitations of a power source, the method comprising: receiving a supply voltage provided by the power source; concurrently generating a first intermediate signal indicative of the supply voltage and a second intermediate signal indicative of the supply voltage using an analog electronics section, wherein the first intermediate signal responds at a first rate to variation in the supply voltage and the second intermediate signal responds at a second rate to variation in the supply voltage, the second rate different from the first rate; using a comparator electronics section, comparing the first intermediate signal and the second intermediate signal and providing a change detect signal upon detecting at least a predetermined difference between the first intermediate signal and the second intermediate signal, said difference indicative of a possible change in limitations of the power source; providing an output signal indicative of the change detect signal, the output signal usable for operating further circuitry in response to the possible change in limitations of the power source.

In accordance with another aspect of the present technology, there is provided a method for facilitating adapting to time-varying limitations of a power source, the method comprising: monitoring a supply voltage of the power source and generating an interrupt signal in response to a predetermined amount of change in the monitored supply voltage, said change indicative of a possible change in limitations of the power source, wherein said monitoring and generating is performed using circuitry configured as at least partially analog; in response to generation of the interrupt signal: switching a second stage circuit from a standby mode to an active mode; monitoring the supply voltage using the second stage circuit while in the active mode; confirming or disconfirming the possible change in limitations of the power source using the second stage circuit while in the active mode; triggering further electronic operations upon confirming the possible change in limitations; and returning the second stage circuit to the lower-power standby mode upon disconfirming the possible change in limitations.

BRIEF DESCRIPTION OF THE FIGURES

These and other features of the technology will become more apparent in the following detailed description in which reference is made to the appended drawings.

DETAILED DESCRIPTION OF THE TECHNOLOGY

Definitions

Figure 1:
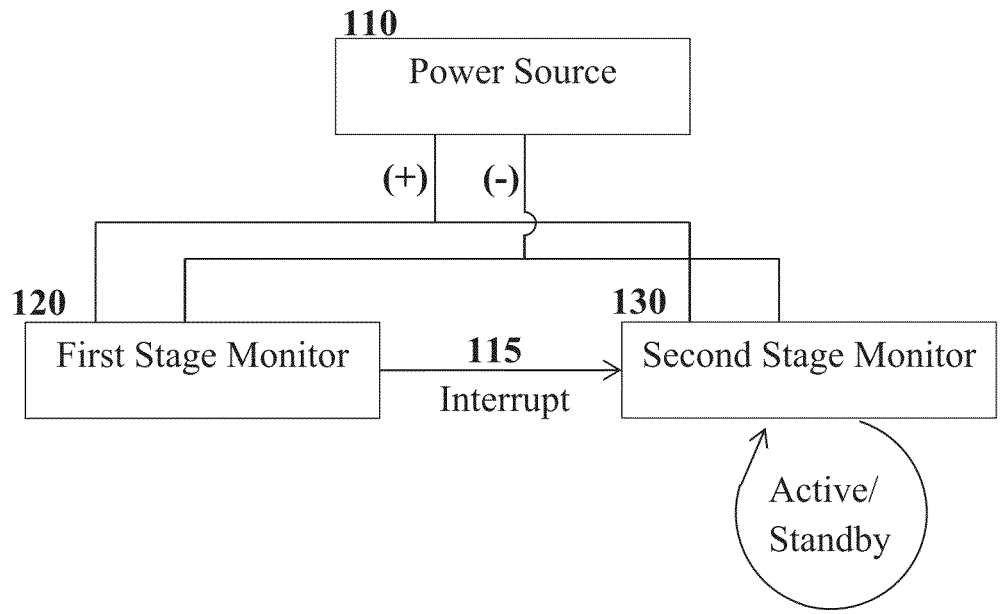
FIG. 1 illustrates a two-stage architecture used for monitoring a power source in accordance with embodiments of the present technology.

As used herein, the term "about" refers to a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this technology belongs.

The present technology provides a method and apparatus for adapting to limitations in a power source, by monitoring a power source and awakening an electronic module from a low power or standby mode when the limitations of its power source are relaxed. The power source exhibits different limitations at different times, possibly by switching abruptly between limitations. As a particular example, the power source may be a vehicular power source, which is in a more limited state when the vehicle engine is turned off and the power source relies on a battery, and which is in a less limited state when the vehicle engine is turned on and the power source is fed by an alternator or other such electricity source. The power source limitation may correspond to an amount of stored energy currently available for use as electrical energy. Additionally or alternatively, the power source limitation may correspond to other limitations such as supply voltage level, available current, available power, and the like.

The present technology facilitates a power consumption reduction by causing electronics to enter a low power consumption "standby" mode when the power source is in its more limited state. The standby mode may correspond to a sleep mode. Various electronics components may be powered down or operated at a lower power in the standby mode. In some embodiments, a clock frequency sourcing a clock signal for various electronics is reduced in the standby mode in order to conserve power. Furthermore, the present technology facilitates monitoring of the power source in a manner which consumes less power (for example average power) or which consumes less energy, or both, than at least some other prior art solutions.

Embodiments of the present technology in part comprise monitoring for voltage variations in the power source in order to detect changes in state, rather than monitoring for voltage levels. Monitoring for voltage variation rather than voltage levels allows for relatively simple and low-power monitoring circuitry to be employed. In addition, monitoring for voltage variation allows adequate monitoring to be performed independent of factors such as battery degradation, power system aging, temperature, and other factors which may influence operating voltage levels.

In some embodiments, the present technology provides a monitoring solution having an average power consumption of less than about 5 mA. In some embodiments, the present technology provides a monitoring solution having an average power consumption of less than about 3 mA. In some embodiments, the present technology provides a monitoring solution having an average power consumption of about 2.5 mA. Such a power consumption level may be due in part to usage of a two-stage architecture, with the first stage consuming less power on average than the second stage, and the second stage being powered down for a substantial proportion of time. In some embodiments, the first stage is substantially always operational and consumes power of about 120 microamps. The second stage may consume significantly higher power when in an active state, for example between 20 mA and 40 mA, but may be configured to operate in the active state relatively rarely, i.e. with a low duty cycle, so that the total average power consumption is low. The second stage will consume considerably less power when in its inactive state. The first stage may be configured to cause the second stage to transition to the active state only when the second stage is required to verify a potential power supply state transition.

FIG. 1 illustrates a two-stage architecture used for monitoring a power source 110 in accordance with embodiments of the present technology. A first stage 120 is operatively coupled to the power source 110 and monitors a voltage thereof. The first stage comprises a relatively low-power monitoring circuit which operates independently of microprocessors or other digital components driven by a clock circuit. A second stage 130 is operatively coupled to the power source 110 and monitors a voltage thereof, and is also operatively coupled to the first stage 120 in order to receive an interrupt signal 115 therefrom. The second stage may comprise a relatively higher-power monitoring circuit which may include components such as a microprocessor, ADC, and the like.

Although the term "interrupt" is used herein, the electronics in receipt of the interrupt may be in a standby state or sleep mode, and hence the operation that is being interrupted may be the standby or sleep operation itself. Therefore, in some embodiments, the interrupt signal may instead be regarded as a wake-up signal.

The first stage 120 is configured to monitor the power source 110 and generate the interrupt 115 in response to detecting power source conditions which are indicative that the power source may have transitioned from a more limited state to a less limited state. For example, the first stage 120 may generate the interrupt 115 in response to a predetermined variation in power source voltage. The predetermined variation may be a positive change in voltage or a negative change in voltage, and may be temporary or permanent. In some embodiments, the interrupt signal is a voltage change, for example from a first voltage level to a second voltage level which may be lower or higher than the first voltage level. In some embodiments, the interrupt signal is a pulsed voltage change. Additionally or alternatively, in various embodiments the interrupt signal may correspond to a change in another electrical characteristic, such as an impedance change, current change, pulse train frequency or pulse width change, or the like.

Since the first stage 120 operates with low power, it facilitates power system monitoring while presenting a low burden to the power system. However, it may be less reliable than higher-power solutions, and thus may falsely detect power source transitions when there are none. In order to mitigate this issue, a second stage 130 may also be provided.

The second stage 130 operates in a low-power standby state until it receives an interrupt signal 115. In the standby state, the second stage does not monitor the power source, and various components may be powered down except those necessary to receive and respond to the interrupt signal. The second stage is configured, in response to receiving the interrupt signal, to power up and monitor the power source. Monitoring of the power source may comprise obtaining and digitizing several samples of the power source voltage level, for example using an ADC, and subsequently analyzing the samples, for example using a microprocessor. The second stage is configured to make its own determination of whether the power source has transitioned from a more limited state to a less limited state. Determination by the second stage may be more reliable. Additionally or alternatively, increased reliability may stem from independent confirmation of the transition by the second stage. Upon a determination by the second stage 130 that the power source has transitioned, further operations may be performed, such as powering up the remainder of the electronics module and performing other associated operations. Upon a determination by the second stage 130 that the power source has not transitioned (and hence that the first stage has falsely detected such a transition), the second stage may power down and await subsequent interrupts.

In some embodiments, the interrupt 115 to the second stage 130 functions to wake up the entirety of an electronics module such as a wireless modem. In other embodiments, the interrupt 115 to the second stage 130 functions to wake up second-stage monitoring functionalities. The second stage 130 then determines whether to wake up the remainder of the electronics module or to return to a low-power mode without waking up the remainder of the electronics module.

In various embodiments, the present technology may further be configured to make a determination, for example at the first stage, second stage, or both, of whether the power source has made the reverse transition from a less limited state to a more limited state. Such a determination may be made similarly to those described elsewhere herein. However, when the power source is in the less limited state, low-power monitoring may not be as critical, and the second stage may therefore be used without the first stage in some embodiments.

First Stage

Figure 2:
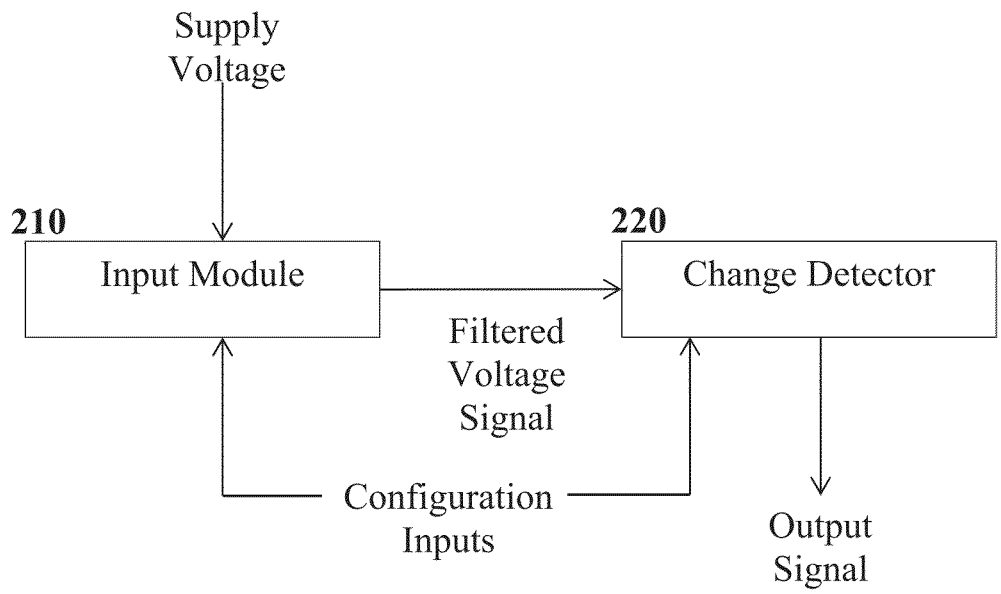
FIG. 2 illustrates a block diagram of a low-power circuit for detecting a change in a power source supply voltage, in accordance with embodiments of the present technology.

FIG. 2 illustrates a block diagram of a low-power circuit for detecting a change in a power source supply voltage, in accordance with embodiments of the present technology. The circuit comprises an optional input module 210 which is configured to operate as a filter, buffer, signal conditioner, or a combination thereof, and a supply voltage change detector 220. The input module provides a signal representative of the supply voltage to the supply voltage change detector. The input module 210 may be connected directly to the power source, for example by connection to the positive and negative voltage terminals of the power source supply lines. In some embodiments, one of the terminals may be grounded. The input module 210 may be configured to filter or otherwise condition the supply voltage, for example by providing an output signal indicative of the supply voltage which may be adjusted in one or more characteristics. In some embodiments, the input module 210 may be configured to act as a buffer, for example in order to present a high-impedance input for coupling to the power supply. The supply voltage change detector 220 monitors the power supply voltage or input module output and generates a signal indicative of changes to the power supply voltage when characteristics of such changes exceed a predetermined threshold level. The supply voltage change detector 220 may be configured to respond to positive supply voltage changes, negative supply voltage changes, or both.

Figure 3:
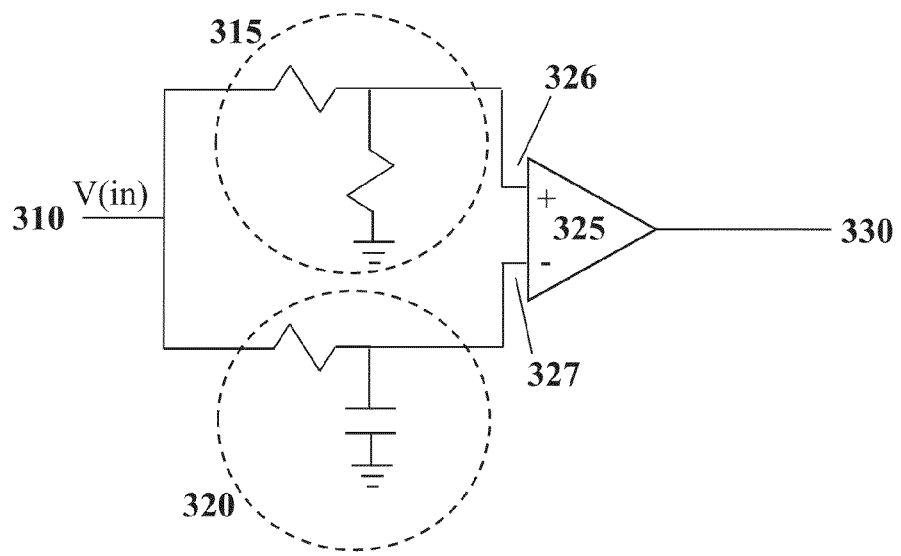
FIG. 3 illustrates a portion of a low-power circuit for detecting a positive change in a positive power source supply voltage, in accordance with embodiments of the present technology.

FIG. 3 illustrates a portion of a low-power circuit for detecting a positive change in a positive power source supply voltage, in accordance with an embodiment of the present technology. The circuit is operatively coupled at node 310 to the power source in order to detect voltage V(in). The coupling may be direct or indirect. For an indirect coupling, a buffer, filter, sensitivity and slew rate adjustment circuit, or the like, may be interposed between the power source voltage supply and the circuit. Two branches are provided, with a resistive voltage divider network 315 operatively coupled to the non-inverting input 326 of an amplifier 325 (such as an operational amplifier) and a circuit 320 having a series resistor and parallel ground-connected capacitor operatively coupled to the inverting input 327 of the amplifier 325. The amplifier provides an output voltage 330 which may be used in generation of an interrupt signal indicative of a change in the voltage V(in).

A simplified conceptual operation of the above circuit follows. When V(in) is substantially constant and positive, the capacitor behaves as an open circuit and the voltage at input 327 is substantially equal to V(in). Due to operation of the voltage divider network 315, the voltage at input 326 is lower than V(in). Hence, the amplifier output voltage 330 swings to its low state, e.g. ground (assuming a sufficiently high gain amplifier). If the input voltage V(in) rises sufficiently and sufficiently quickly, then the voltage at input 326 also rises at approximately the same rate. However, due to the grounded capacitor, the voltage at input 327 rises at a slower rate, and hence for sufficient changes in V(in) the voltage at input 326 may be temporarily higher than the voltage at input 327. In this event, the amplifier output voltage 330 swings to its high state, e.g. +3 V if fed from a +3 V supply. The output voltage thus pulses high to indicate a change in the voltage source supply voltage, and this pulse may be used to drive an interrupt. The pulse may optionally be at least temporarily latched using a latching circuit. The amplifier 325 is responsive to the concurrent voltage levels at its inputs 326 and 327.

More generally, embodiments of the present technology provide a comparator circuit which is configured to generate a first signal indicative of input voltage and a second signal indicative of a time-dampened or delayed version of the input voltage. The second signal may be generated by providing a capacitor to be charged, which dampens changes to the input voltage due to charging time of the capacitor. The comparator circuit compares the first signal to the second signal, and if a sufficient difference is detected, the comparator circuit outputs a signal indicative that a sufficient voltage change has occurred.

In some embodiments, the grounded resistor in the voltage divider network 315 may have a relatively high resistance, so as to not draw a large amount of quiescent current. In some embodiments, the input voltage may be buffered so that only a small amount of current flows.

The circuit of FIG. 3 may be adapted to detect a negative change in a positive power source supply voltage by switching the inverting and non-inverting inputs 326 and 327 of the amplifier 325, that is so that the voltage divider network 315 is coupled to the inverting input 327 and the circuit 320 is connected to the non-inverting input 326. Operation of this circuit is analogous to operation of the illustrated circuit.

In some embodiments, circuitry for detecting a positive change in a power source supply voltage may be provided in parallel with circuitry for detecting a negative change in a power source supply voltage, thereby providing circuitry which detects either a positive or a negative change.

In various embodiments, amplifiers used herein, such as amplifiers 325 and other amplifiers denoted by the standard triangular symbol (for example those depicted in FIGS. 4A and 4B), may be operational amplifiers, which typically exhibit high gain and high input impedance. Alternatively, other amplifier configurations may be used, such as differential amplifiers, long-tailed pairs, instrumentation amplifiers, or the like. In various embodiments, it is desirable that an amplifier has suitable characteristics such as high input impedance, low quiescent current draw, adequate responsivity, and the like. For the purposes of understanding the principles of operation of the technology, such amplifiers may be regarded as ideal operational amplifiers, although a worker skilled in the art would readily understand practical implementation details and selection of non-ideal amplifiers.

Figure 4A:
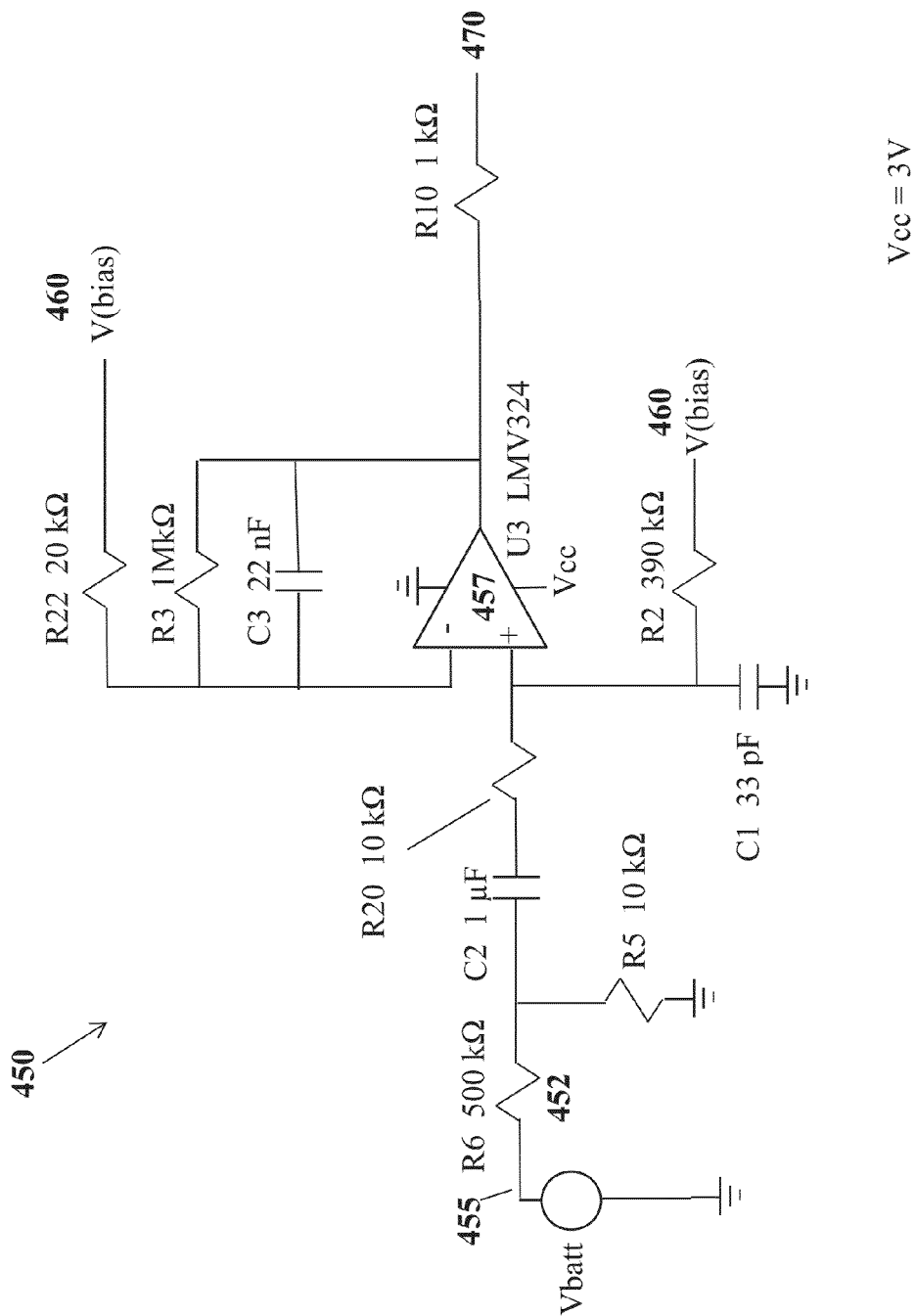
FIGS. 4A and 4B illustrate a low-power circuit for detecting a change in a power source supply voltage, in accordance with embodiments of the present technology.
Figure 4B:
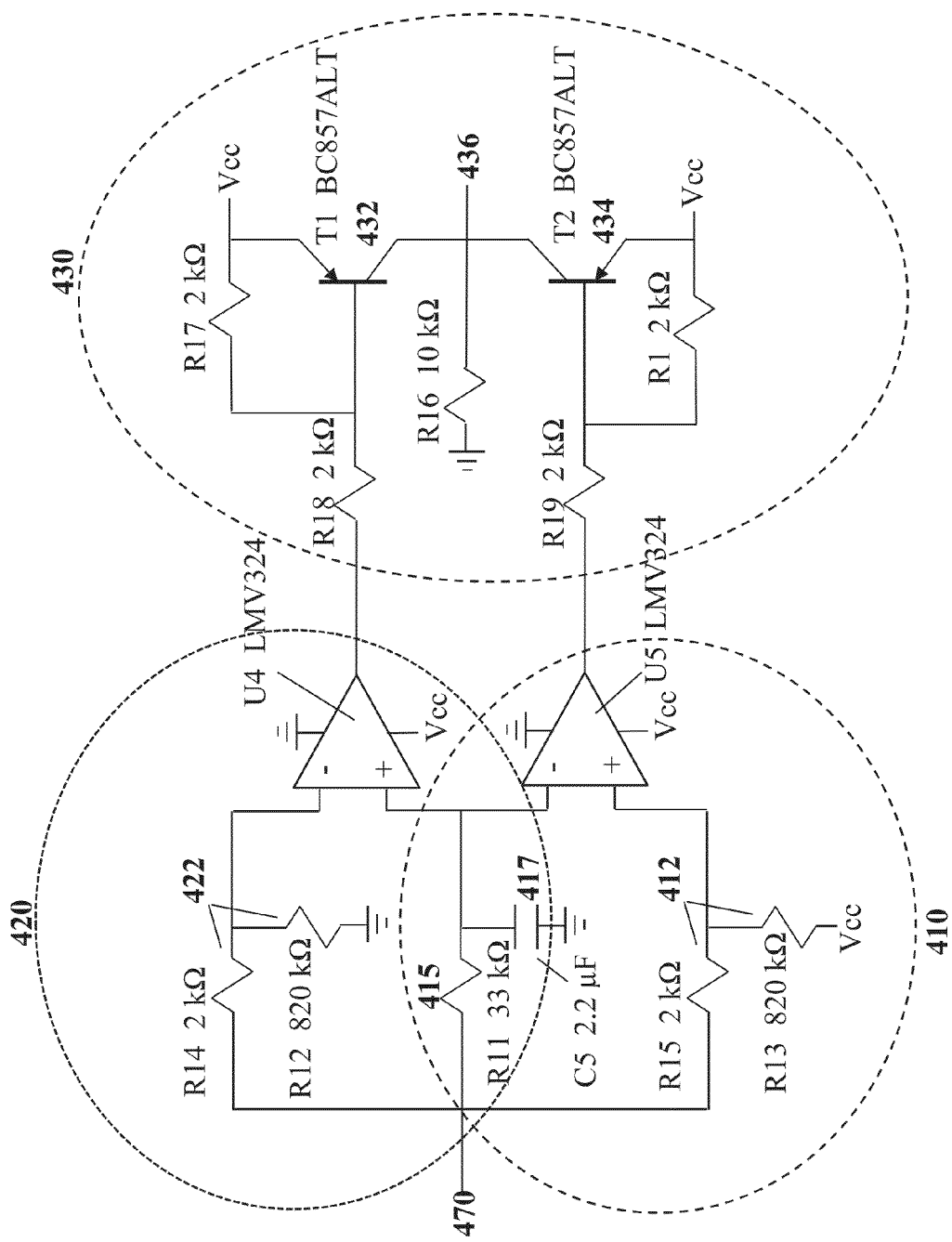

FIGS. 4A and 4B illustrates a low-power circuit for detecting a change in a power source supply voltage, in accordance with embodiments of the present technology. This circuit incorporates positive pulse detection circuitry 410 as described with respect to FIG. 3, in parallel with complementary and analogous negative pulse detection circuitry 420. The outputs of the positive and negative pulse detection circuitry are coupled together via an output stage 430 which comprises a pair of transistors 432, 434 configured to operate as switches for controlling a common output 436. The output 436 may be used as an interrupt signal as described elsewhere herein.

Values of the various resistors and capacitors on the input side of the pulse detection circuitry 410 and 420 may be selected to provide for desired pulse detection behaviour. The resistance values for the pair of resistors 412 feeding the non-inverting input of the amplifier in pulse detection circuitry 410 may be configured to provide for a desired sensitivity level of that pulse detection circuitry 410. The resistance values for the pair of resistors 422 feeding the inverting input of the amplifier in pulse detection circuitry 420 may be configured to provide for a desired sensitivity level of that pulse detection circuitry 420. The resistance value of the resistor 415 and the capacitance value of the capacitor 417 may be configured so as to provide a desired voltage reference level incorporating a desired amount of time delay, for providing to the inputs of the two amplifiers coupled thereto, the amplifiers operating as comparators. In some embodiments, the resistor 415 and capacitor 417 may be configured to facilitate filtering of slow signal variation.

The circuit further incorporates sensitivity and slew rate adjustment circuitry 450, which accepts as input 455 the power supply voltage and provides as output 470 a filtered signal representative of the input. The output 470 is provided as input to the pulse detection circuits 410 and 420. The sensitivity and slew rate adjustment circuitry 450 exhibits a high input impedance, due at least in part to the 500 kOhm resistor 452. The sensitivity and slew rate adjustment circuitry 450 further accepts as input a bias voltage signal 460 which can be adjusted to control the functional relationship between the output 470 and the input 455. The sensitivity and slew rate adjustment circuitry 450 comprises an amplifier 457 which utilizes feedback.

The sensitivity and slew rate adjustment circuitry 450 facilitates filtering of the input signal in order to mitigate instances of false detection by the pulse detection circuits. This may comprise damping or limiting fluctuations in the voltage input which are present due to factors other than power source state transitions (e.g. corresponding to turning the vehicle engine on or off). Such fluctuations may occur due to electrical activity such as switching on or off loads such as lighting, vehicle radio, or other vehicle electronics, maintenance activities, sudden environmental changes, or the like.

With further regard to the sensitivity and slew rate adjustment circuitry 450, the amplifier 457 and associated circuitry is used to scale the signal and filter the input voltage, for example to remove undesired spectral components. Values of the various resistors and capacitors in the circuitry 450 may be selected to provide a desired signal gain, low-pass filter cutoff frequency and/or low-pass filter time constant, high-pass filter cutoff frequency and/or high-pass filter time constant, or the like.

In various embodiments, the first stage circuitry consists essentially of analog components rather than digital components. This may be seen with respect to the above description which operates on signal components which may vary substantially continuously with respect to voltage and which may vary substantially continuously in time. For example, inputs to the pulse detection circuitry are analog signals, as are inputs and outputs of the sensitivity and slew rate adjustment circuitry. An exception is that, as illustrated, the voltage comparators of the pulse detection circuitry and the subsequent output stage circuitry both provide two discrete voltage levels as output. However, the first stage circuitry as illustrated above operates without use of a clock signal or other timing signal. Hence the first stage circuitry may be characterized in part in that it operates independently of such clock signals (i.e. is unclocked) and hence consists essentially of continuous-time circuitry.

In some embodiments, the first stage voltage detection circuitry illustrated in FIGS. 4A and 4B draws less than 240 microamps on average. In some embodiments, the first stage voltage detection circuitry illustrated in FIGS. 4A and 4B draws about 120 microamps on average. In some embodiments, and assuming production in volume, the first stage voltage detection circuitry illustrated in FIGS. 4A and 4B costs less than $1.00. Costs may be less than about 40 cents in some instances. Costs may be about 20 cents in some instances.

Second Stage

Figure 5:
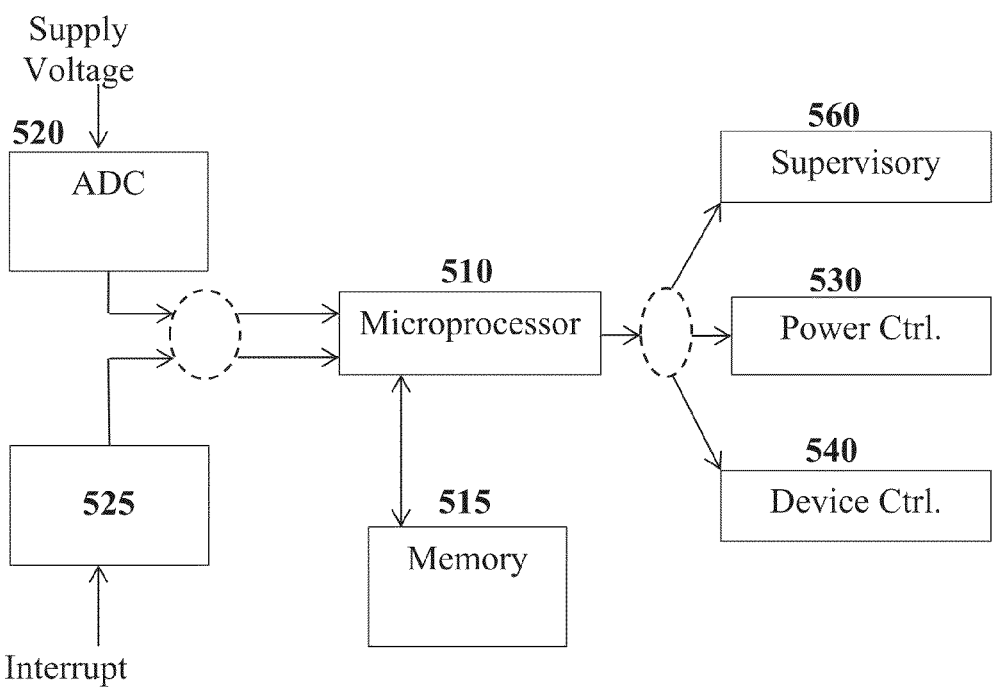
FIG. 5 illustrates a second stage circuit provided in accordance with an embodiment of the present technology.

FIG. 5 illustrates a second stage circuit provided in accordance with an embodiment of the present technology. The second stage circuit comprises a microprocessor 510 and a memory 515 configured to hold instructions for execution by the microprocessor. The second stage circuit further comprises an ADC circuit 520 operatively coupled to the power source supply voltage and configured to sample the power source supply voltage and provide digitized representations of said samples to the microprocessor 510. The second stage circuit further comprises an interrupt input 525 which is configured to receive an interrupt signal from the first stage. The second stage circuitry is configured, for example through provision of appropriate software, firmware and/or hardware circuitry, to transition to a low-power mode under certain trigger conditions, and to transition from the low-power mode to a high power mode upon receipt of an interrupt signal via the interrupt input 525. The interrupt signal may be a positive or negative voltage pulse of at least predetermined length, for example. In some embodiments, power control circuitry 530 facilitates such mode transitions. In some embodiments, power control functionality is performed at least in part by the microprocessor 510 executing associated instructions stored in memory 515.

In various embodiments, the microprocessor 510 may be configured to also perform other operations, for example associated with a module device which is supported by the present technology. For example, the module device may be a vehicle tracker or other device which is integrated with a vehicle and powered from the vehicle's power system. The module device may provide wireless communication capabilities, user interface capabilities, location or GPS capabilities, monitoring capabilities, or the like, or a combination thereof. The microprocessor 510 may thus be configured to execute program instructions associated with these functions when in its high-power active mode, as well as executing program instructions for verifying the power source state transition in response to the interrupt signal 525.

Typically, the module device will consume sufficient amounts of power that it is desirable to switch the module device off when the power supply is in its more limited state. Thus, in some embodiments, the power control circuitry 530 or power control software or firmware is configured to transition the microprocessor 510 and other module device components to a low-power standby state when the power supply is in its more limited state, and to a higher-power active state when the power supply is in its less limited state. In some embodiments, the second stage comprises a device control module 540 which is configured to generate signals for causing various components of the module device to transition between high and low power states. In some embodiments, the device control module 540 may simply switchably route supply power to various components of the module device.

It will be readily understood by a worker skilled in the art that the second stage circuitry of FIG. 5 may be varied in several ways. For example, some or all of the various components described above may be implemented by a microcontroller. The ADC may be an off-the-shelf ADC or another circuit configured to translate an analog voltage level into a signal indicative of same and usable by the microprocessor.

In some embodiments, upon receipt of an interrupt signal via the interrupt input 525, the second stage is configured to exit a standby mode and monitor the supply voltage by executing a series of ADC acquisition operations using the ADC circuit 520. For example, the ADC acquisitions may be performed at a minimum sampling rate of about 10 Hz over a duration of about 1 s. The ADC circuit 520 samples the power supply voltage and provides digitized sample information to the microprocessor for analysis. The microprocessor 510 is configured to execute program instructions for analysis of the digitized sample information. The sample information may be analyzed to determine if the supply voltage exhibits patterns that are indicative of a particular state. For example, for automotive applications, if the sample information indicates that the supply voltage is at 14 V with little fluctuation, the microprocessor may detect this and infer that the power source is in a state corresponding to the vehicle engine being on and the alternator running. Based on an analysis of the power supply voltage and/or voltage variation during the sampling period, the second stage may determine that a power supply state transition has or has not occurred. If it is discovered that a state transition has not occurred, the second stage is configured to re-enter standby mode. Thus, the second stage prevents a false state transition detection by the first stage from triggering full and sustained activation of the second stage and subsequently of the module device to be activated. If a state transition is confirmed to have occurred, the second stage may be configured to initiate further operations, for example by activating other aspects of the module device.

In some embodiments, the ADC is configured to take about ten samples over a one second interval. The sampling interval may generally be configured so that enough time is provided in order to accurately determine whether the engine has started, and should thus be of at least the order of time taken for power supply events associated with engine starting events to be recognizable, given the resolution and sampling frequency of the ADC. In one embodiment, the sampling interval is one second or greater. In a further embodiment, the sampling interval is two seconds or less.

In some embodiments, the module device and optionally the second stage may be configured to support an operating system such as Open AT.

It is noted that, in some embodiments, since the first stage is configured to monitor for voltage variations rather than absolute voltage levels, it may generate "false detection" interrupt signals due to battery voltage variation that is not the result of a power supply change of state event. In such a case of "false detection", the second stage exits standby mode, verifies the battery activity by ADC reading and returns to standby mode if the profile of the voltage variation does not match an expected pattern commensurate with state transition, as described above. Occasional false detections have only a relatively small impact on average power consumption, since the second stage will only be active for a few seconds at a time. However, if the first stage circuit drifts out of calibration significantly so that false detections occur with high frequency, power consumption may rise.

In some embodiments, in order to counteract tendencies toward false detection, the second stage may comprise a supervisory module 560 which is configured to monitor a frequency of false detection events and adjust operation of the first stage in response to the frequency of false detection events exceeding a predetermined threshold level. Operation is adjusted in a manner that attempts to decrease the frequency of first stage false detections, while as much as possible refraining from impacting the ability to timely detect "true" power supply state transitions. In some embodiments, the supervisory module 560 may be configured to adjust the input bias voltage of the first stage sensitivity and slew rate adjustment circuit 450. In some embodiments, the supervisory module 560 may additionally or alternatively issue a user alert indicative that the first stage is issuing an unacceptably high level of false detections.

In some embodiments, the second stage may be configured to ignore interrupt signals generated within a predetermined time period since the last interrupt signal, thereby limiting the potential power drain due to false detections. However, it is noted that this approach may result in increased delays in responding to true state transitions. Hardware or software may be used to ignore interrupt signals that occur within a time frame such as a few seconds following an initial interrupt signal. Various "debouncing" circuits or functionally equivalent software or firmware may be employed for this purpose.

In various embodiments, once the second stage receives the interrupt signal, it exits the standby mode, executes a 1 to 2 second voltage monitoring operation by ADC reading at 100 ms (faster sampling rate may be possible), and analyzes the ADC samples using an Open AT or other application to confirm that the power system has transitioned to a less constrained state (e.g. due to the vehicle engine having been turned on). If the detection is not confirmed, the module will resume the standby mode until it receives the next interruption.

In some embodiments, the second stage consumes between 20 mA and 40 mA when sampling and analyzing the power supply voltage level, and substantially less when in standby mode (for example, on the order of 0.12 mA). In some embodiments, the duty cycle of the second stage is less than 20%. In some embodiments, the duty cycle of the second stage is less than 15%. In some embodiments, the duty cycle of the second stage is less than 10%. In some embodiments, the duty cycle of the second stage is less than 5%. In some embodiments, the duty cycle of the second stage is less than 1%. The duty cycle may refer to the proportion of time that the second stage is in the non-standby mode. Once the second stage enters the non-standby mode, it may remain in that mode until at least sampling and analysis of the power source supply voltage is completed.

The duty cycle may fluctuate due to conditions. For example, when the vehicle is turned off and unattended, the duty cycle may be relatively low, and when the vehicle is parked but a user is utilizing the power source for auxiliary functions such as radio, power windows, and the like, then the duty cycle may be relatively higher, since this usage of the power source may result in a higher frequency of interrupt signals generated by the first stage.

In some embodiments, the second stage may be configured to use other means to detect the power source state. For example, in the case of a vehicle, the second stage may use an accelerometer to detect engine vibration which would indicate that the engine is turned on and that the power source is therefore fed by the alternator and in a less limited state. As another example, the second stage may use GPS readings to determine if the vehicle is in motion, which would also indicate that the engine is turned on. Various indicators may be combined and used to infer power source state with varying degrees of confidence.

Figure 6:
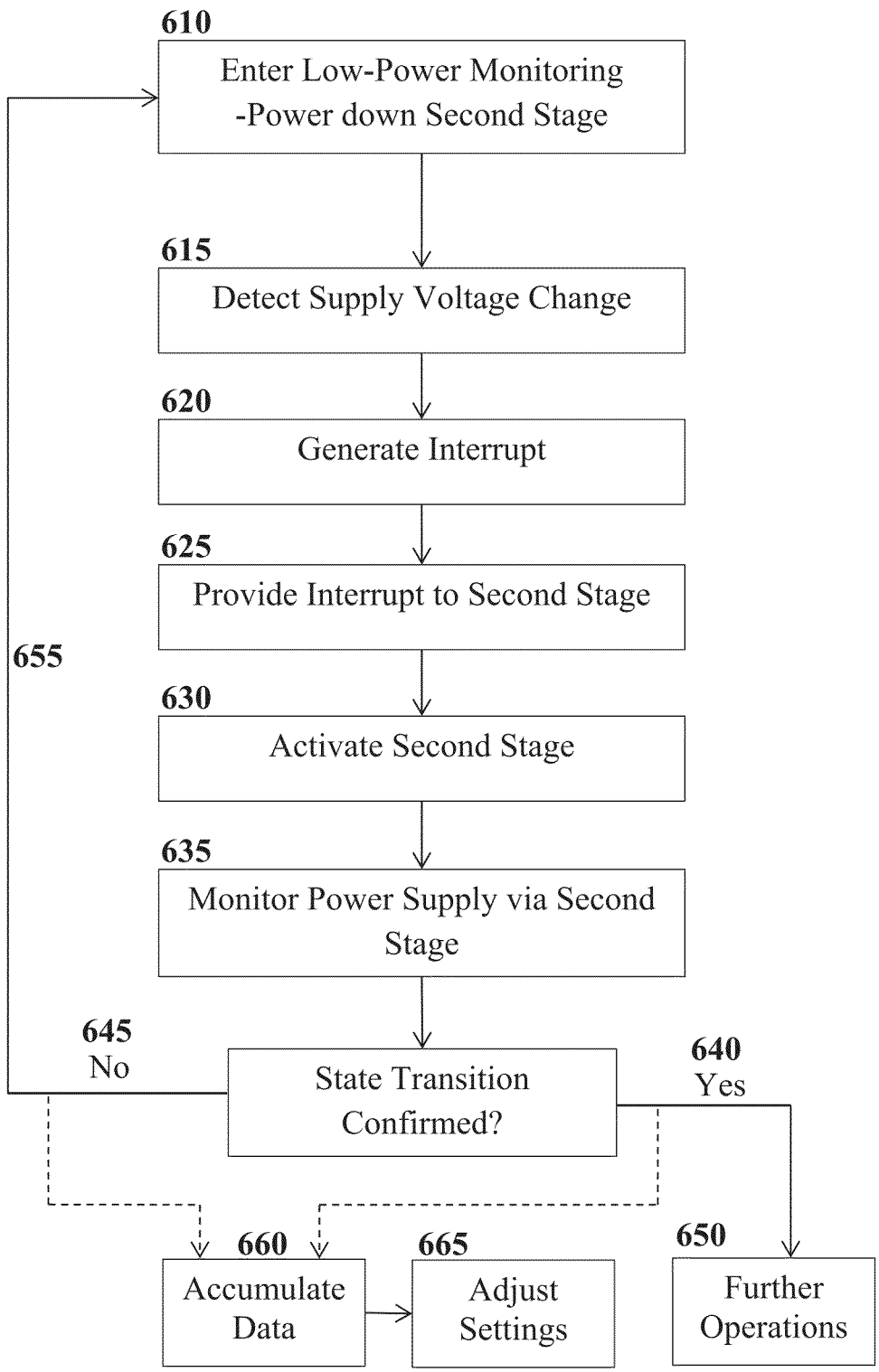
FIG. 6 illustrates a method for adapting to time-varying limitations in a power source, in accordance with embodiments of the present technology.

FIG. 6 illustrates a method for adapting to time-varying limitations in a power source, in accordance with embodiments of the present technology. The method comprises entering 610 a low power monitoring mode in which a first stage monitoring circuit is active and a second stage monitoring circuit is powered down. The second stage monitoring circuit may comprise a microprocessor-based monitoring circuit which consumes more power than the first stage monitoring circuit alone but may be more reliable. The method further comprises, upon detecting 615 a change in supply voltage which is potentially indicative of a power source state transition, generating 620 an interrupt signal and providing 625 the interrupt signal to the second stage monitoring circuit. The method further comprises, upon receiving the interrupt signal at the second stage monitoring circuit, transitioning 630 the second stage monitoring circuit to an active mode and monitoring 635 the power source in order to determine its current state. This may confirm or reject the detection of the power source state transition by the first stage monitoring circuit. If the power source state transition is confirmed 640, further operations may be performed 650 such as transitioning associated electronics to an active mode and performing suitable operations, such as GPS monitoring, accelerometer monitoring, etc. If the power source state transition is rejected 645, the second stage monitoring circuit may transition 655 back to a standby mode in which monitoring functions are ceased until a subsequent interrupt signal is generated.

At a lower frequency, the method may further comprise accumulating 660 data indicative of detection accuracy of the first stage monitoring circuit and adjusting 665 settings thereof, for example by adjusting a bias signal provided to the first stage monitoring circuit which controls filtering and sensitivity thereof, by adjusting filtering and sensitivity of the second stage, or both. The bias voltage may be output by a digitally controlled voltage source, for example.

Alternate Detection Circuit

Figure 7A:
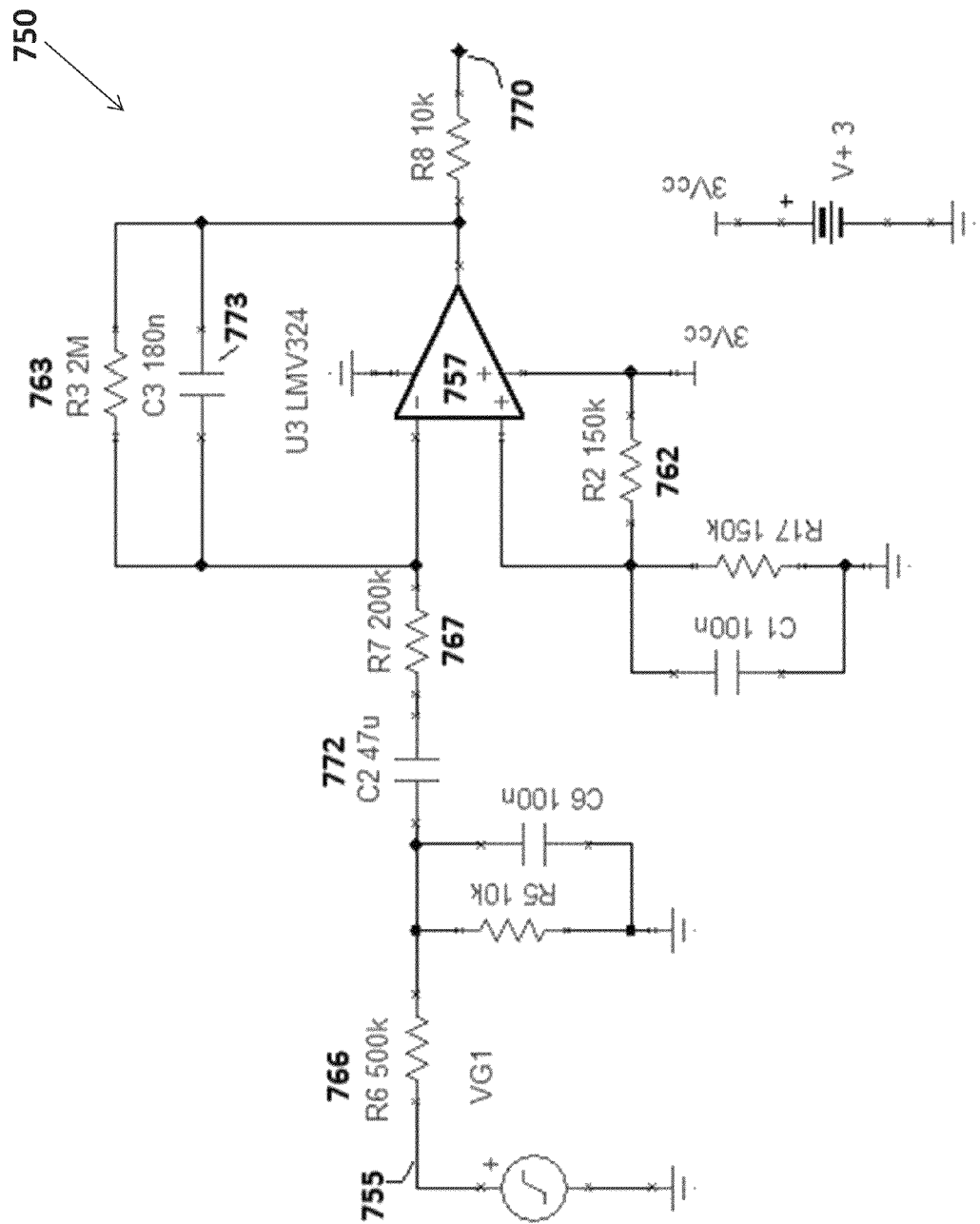
FIGS. 7A and 7B illustrate another low-power circuit for detecting a change in a power source supply voltage, in accordance with embodiments of the present technology.
Figure 7B:
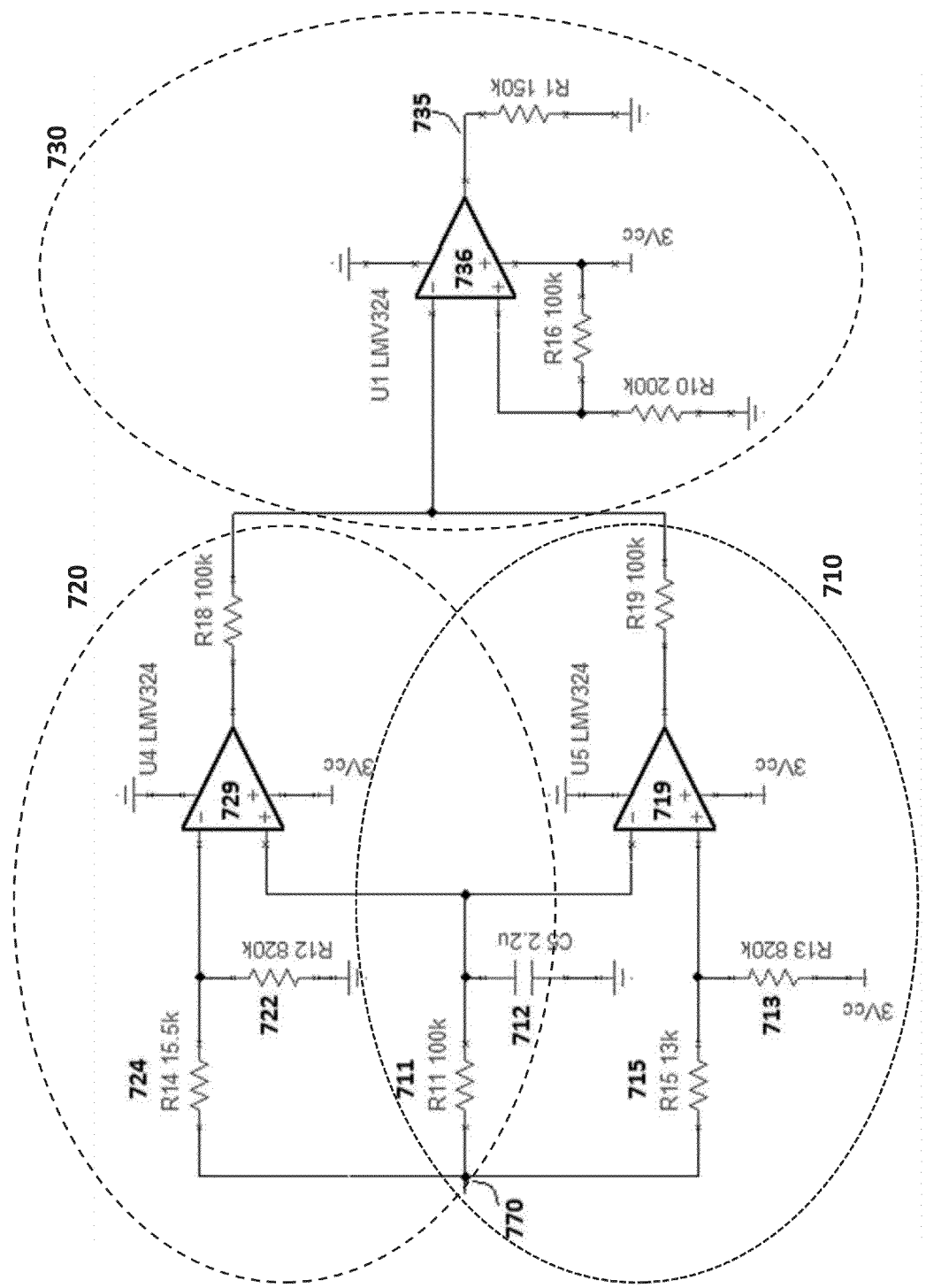

FIGS. 7A and 7B illustrates another low-power circuit for detecting a change in a power source supply voltage, in accordance with embodiments of the present technology. This circuit incorporates positive pulse detection circuitry 710 as described with respect to FIG. 3, in parallel with complementary and analogous negative pulse detection circuitry 720. The outputs of the positive and negative pulse detection circuitry are coupled together via an output stage 730 which comprises an amplifier 735 and associated circuitry configured to combine the outputs of the two pulse detection circuits 710 and 720 into a single output 736 which may be used as an interrupt signal as described elsewhere herein.

Values of the various resistors and capacitors on the input side of the pulse detection circuitry 710 and 720 may be selected to provide for desired pulse detection behaviour. The resistance values for the resistors 713 and 715 feeding the non-inverting input of the amplifier 719 in pulse detection circuitry 710 may be configured to provide for a desired sensitivity level of that pulse detection circuitry 710. The resistance values for the resistors 722 and 724 feeding the inverting input of the amplifier 729 in pulse detection circuitry 720 may be configured to provide for a desired sensitivity level of that pulse detection circuitry 720. The resistance value of the resistor 711 and the capacitance value of the capacitor 712 may be configured so as to provide a desired voltage reference level incorporating a desired amount of time delay, for providing to the inputs of the two amplifiers coupled thereto, the amplifiers operating as comparators. In some embodiments, the resistor 711 and capacitor 712 may be configured to facilitate filtering of predetermined frequencies of signal variation, the frequencies selectable by the choice of resistance and capacitance values. The resistor 711 and capacitor 712 may operate as a low-pass filter with a given cutoff frequency. Thus, slowly varying signals are passed through this filter to the inputs of the amplifiers 719 and 729, which cause the amplifier inverting and non-inverting inputs to closely correspond, which in turn inhibits pulse detection signals being emitted by the amplifiers. In this way, the low-pass filter facilitates immunity of the pulse detector circuits to slow signal variation.

The circuit further incorporates sensitivity and slew rate adjustment circuitry 750, which accepts as input 755 the power supply voltage and provides as output 770 a filtered signal representative of the input. The output 770 is provided as input to the pulse detection circuits 710 and 720. The sensitivity and slew rate adjustment circuitry 750 exhibits a high input impedance, due at least in part to the large resistance value of resistor 766 (for example 500 kOhm). The sensitivity and slew rate adjustment circuitry 750 comprises an amplifier 757 which utilizes feedback.

With further regard to the sensitivity and slew rate adjustment circuitry 750, the amplifier 757 and associated circuitry is used to scale the signal and filter the input voltage, for example to remove undesired spectral components. Values of the various resistors and capacitors in the circuitry 750 may be selected to provide a desired signal gain, low-pass filter cutoff frequency and/or low-pass filter time constant, high-pass filter cutoff frequency and/or high-pass filter time constant, or the like. Resistance values of resistors 763 and 767 may be configured in to provide a desired gain in order to scale the signal. Capacitance value of capacitor 773 and resistance value of resistor 763 may be configured to provide a desired time constant of the low pass frequency filter to remove unwanted signal variation due to high-frequency components. Capacitance value of capacitor 772 and resistance value of resistor 767 may be configured to provide a desired time constant of the high pass frequency filter to remove unwanted signal variation due to low-frequency components.

Resistance values, capacitance values, supply voltage levels, supply current capabilities, amplifier component numbers or types, and other features of the circuit illustrated in FIGS. 4 and 7 are exemplary and may fall within certain predetermined tolerances. Various adjustments to these features may be made in order to adapt the circuit to its operating environment and to adjust behaviour and responsivity thereof. For example, various resistance and capacitance values may be adjusted in order to increase or decrease sensitivity of the circuit to supply voltage changes, to maintain adequate responsivity while rejecting noise, and the like. In some embodiments, one or more resistance values and/or capacitor values are adjustable, for example by varying an adjustment input, replacing components, switching circuit paths, or the like. An example of an appropriate operational amplifier component is the LMV324 low-voltage rail-to-rail output operational amplifier from Texas Instruments.

Application to Vehicle Power Supply Monitoring

The technology will now be described with reference to a specific application. It will be understood that the following application is intended to describe embodiments of the technology that are not intended to limit the technology in any way.

A vehicle power supply monitoring module which includes a two-stage monitoring circuit as described above, is provided and is incorporated into an electronic vehicular tracking device. The tracking device is designed for installation in a hidden place in a vehicle and connected directly to the battery. For ease of installation, no other electrical connections are made between the device and the vehicle. The device may wirelessly communicate with a remote station and/or user module. Wireless communication with a remote station may be via cellular 2G, 3G or 4 G communication protocols, for example. The device may further comprise a GPS module. The device may further comprise an accelerometer or other means for crash detection and datalogging. The device may comprise a back-up battery.

The vehicle power supply monitoring module comprises a two-stage monitoring circuit as described above. When the vehicle engine is turned off, the first stage, the second stage, or both, detect a drop in power supply voltage (e.g. from 14 V to 12 V) or other characteristics such as greater voltage variation. This indicates that the power supply is now limited as it is sourced from the battery only. In response, the monitoring module powers down the tracking device functions and places the second stage in a low-power standby mode. The first stage monitoring circuit subsequently monitors for power supply voltage variation and provides an interrupt signal upon detection of voltage variation that is indicative that the engine has possibly been turned on again. The interrupt signal causes the second stage to exit standby to confirm the power supply state. If the second stage confirms that the vehicle has been turned on, it powers up the remaining functions of the vehicular tracking device. Otherwise, the second stage re-enters the low-power standby mode.

Figure 8:
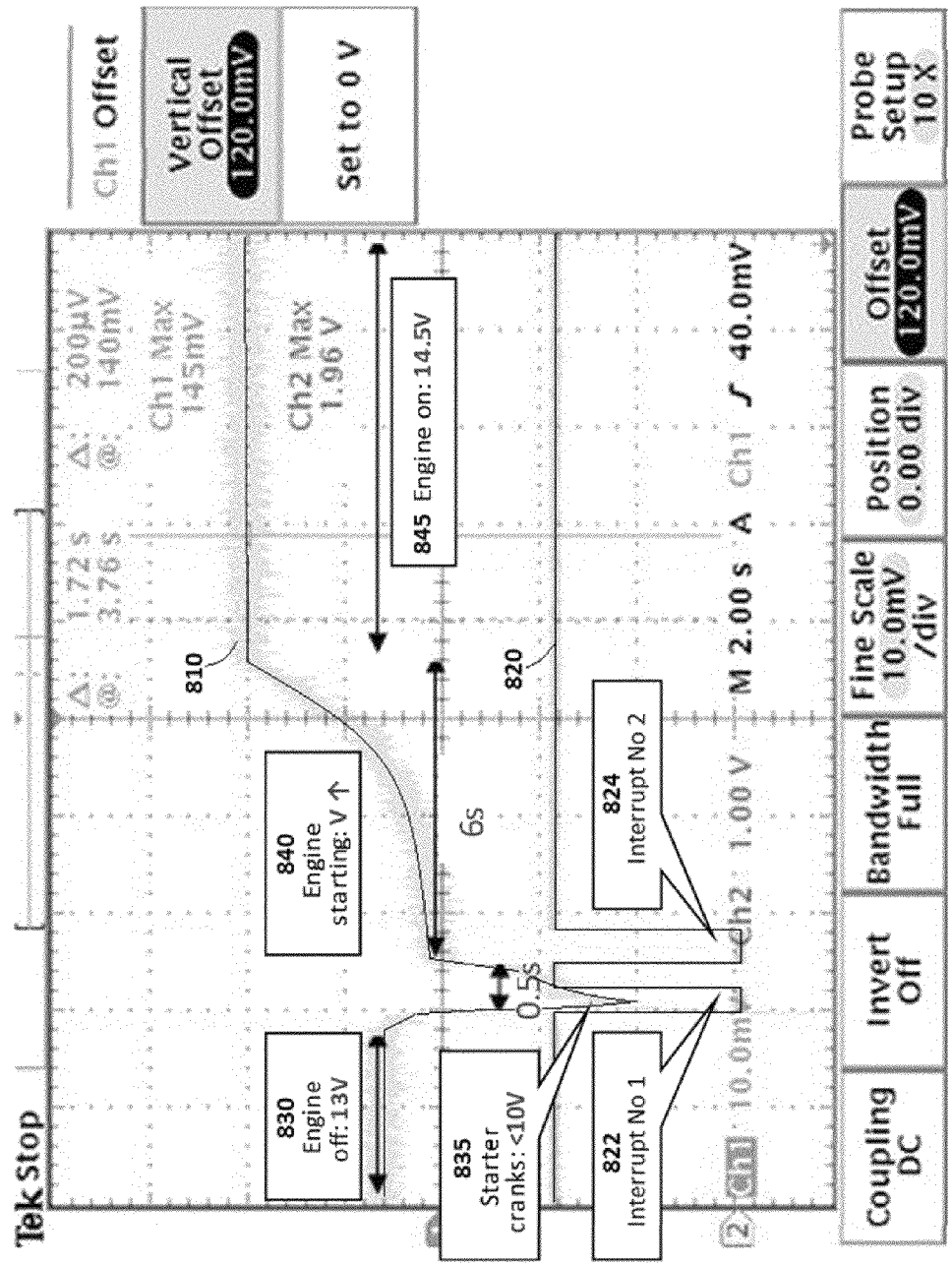
FIG. 8 illustrates a signal levels corresponding to operation of a circuit for detecting changes in a vehicle power source supply voltage, in accordance with an embodiment of the present technology.

FIG. 8 illustrates signal levels corresponding to operation of a circuit for detecting changes in a vehicle battery voltage, in accordance with an embodiment of the present technology. The illustrated signal levels correspond to operation of a circuit, substantially corresponding to the circuit illustrated in FIGS. 7A and 7B, which was installed and tested in a BMW automobile. The signal trace 810 represents variation in the vehicle battery voltage level, that is the circuit input, over time. The signal trace 820 represents variation in the interrupt signal voltage level, that is the circuit output, over time. During a first time interval 830, the vehicle engine is turned off and the vehicle battery voltage is at about 13V. At a second time interval 835 the vehicle starter cranks for about 1 second or less. The battery voltage quickly drops to below 10V due to the current required to operate the starter. During a third time interval 840 of about 6 seconds, the vehicle engine is starting and the alternator starts to charge up the battery, which results in an increase in battery voltage to about 14.5V. During a fourth time interval 845, the battery voltage remains at the 14.5V level, maintained by the alternator as the engine remains on.

Shortly after the start of the second time interval 835, the monitoring circuit responds to the change in battery voltage by generating a first interrupt signal, which corresponds to a first drop 822 in voltage of the signal trace 820. This first drop 822 in voltage can be associated with detection of the starter cranking. Subsequently, the change in battery voltage temporarily subsides and the monitoring circuit recovers. Then, the battery voltage quickly rises again which causes the monitoring circuit to generate a second interrupt signal, which corresponds to a second drop 824 in voltage of the signal trace 820. The second drop 824 in voltage can be associated with detection of the battery voltage rising. It is noted that the monitoring circuit can be tuned so that it does not generate interrupt signals in response to relatively slower changes in voltage, such as those occurring toward the end of the third time interval 840 due to alternator charging. In other embodiments, the monitoring circuit may additionally or alternatively be tuned to generate interrupt signals in response to these events.

The first interrupt signal may be used to wake up a second stage circuit from sleep mode. The second stage circuit is then configured to sample the battery voltage level to confirm that the engine is started. For example, confirmation may correspond to observing that the battery voltage level is rising in accordance with a certain pattern during the third time interval 840 or that the battery voltage exceeds a threshold level such as 14V at one or more appropriate times during the third time interval 840 and/or the fourth time interval 845.

Figure 9:
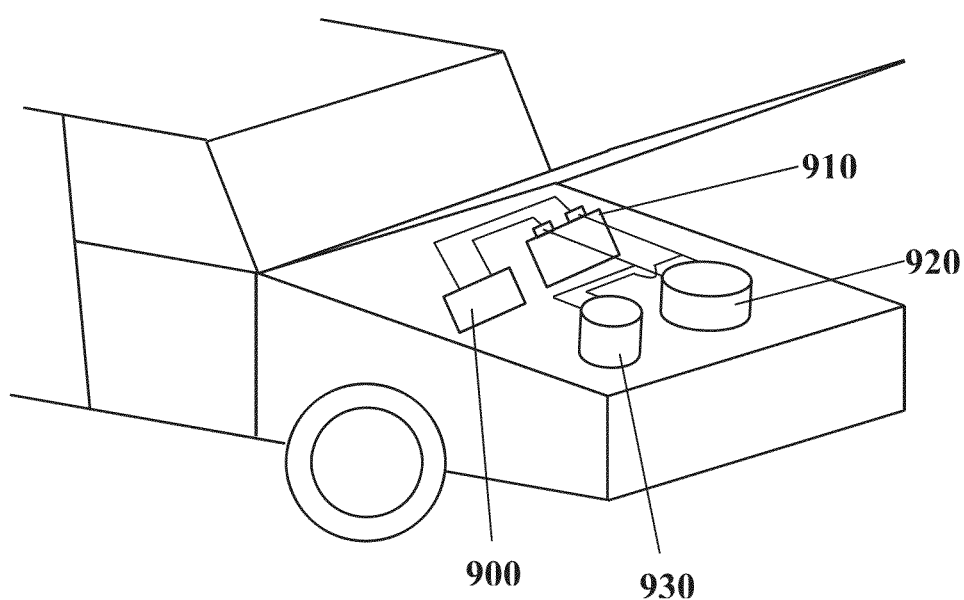
FIG. 9 illustrates a vehicle comprising an apparatus provided in accordance with embodiments of the present technology.

FIG. 9 illustrates a vehicle comprising an apparatus 900 provided in accordance with embodiments of the present technology. The apparatus 900 comprises a vehicle power supply monitoring module, for example comprising at least a first stage circuit as described herein. The apparatus 900 is operatively coupled to the power supply comprising a vehicle battery 910, and monitors voltage levels of same. The apparatus 900 may further comprise a vehicular tracking device or other electronic device, which is activated by the vehicle power supply monitoring module and powered by the vehicle power supply comprising the battery 910. The vehicle further comprises an alternator 920 powered by a vehicle engine (not shown), the alternator 920 coupled to the battery 910 for charging same when the engine is running. The vehicle further comprises a starter motor 930 powered by the battery 910 for starting the vehicle engine.

It will be appreciated that, although specific embodiments of the technology have been described herein for purposes of illustration, various modifications may be made without departing from the spirit and scope of the technology. In particular, it is within the scope of the technology to provide a computer program product or program element, or a program storage or memory device such as a magnetic or optical wire, tape or disc, or the like, for storing signals readable by a machine, for controlling the operation of a computer according to the method of the technology and/or to structure some or all of its components in accordance with the system of the technology.

Acts associated with the method described herein can be implemented as coded instructions in a computer program product. In other words, the computer program product is a computer-readable medium upon which software code is recorded to execute the method when the computer program product is loaded into memory and executed on the microprocessor of an electronics device such as a dedicated power supply monitoring device, or a vehicle tracking device, wireless communication device, machine-to-machine (M2M) device, or other device with built-in power supply monitoring capabilities.

Further, each step of the method may be executed on any computing device, such as an embedded computer, PDA, or the like and pursuant to one or more, or a part of one or more, program elements, modules or objects generated from any programming language, such as C++, Java, PL/1, or the like. In addition, each step, or a file or object or the like implementing each said step, may be executed by special purpose hardware or a circuit module designed for that purpose.

It is obvious that the foregoing embodiments of the technology are examples and can be varied in many ways. Such present or future variations are not to be regarded as a departure from the spirit and scope of the technology, and all such modifications as would be obvious to one skilled in the art are intended to be included within the scope of the following claims.

We claim:

1. An apparatus for use in adapting to time-varying limitations of a power source, the apparatus comprising a first stage circuit including:
   a.) an input terminal for operative coupling to a supply voltage provided by the power source;
   b.) an analog electronics section configured to concurrently generate a first intermediate signal indicative of the supply voltage and a second intermediate signal indicative of the supply voltage, wherein the first intermediate signal responds at a first rate to variation in the supply voltage and the second intermediate signal responds at a second rate to variation in the supply voltage, the second rate different from the first rate;
   c.) a comparator section configured to compare the first intermediate signal and the second intermediate signal and to output a change detect signal upon detecting at least a predetermined difference between the first intermediate signal and the second intermediate signal, said difference indicative of a possible change in limitations of the power source;
   d.) an output configured to provide an output signal indicative of the change detect signal; and
   e.) a second stage circuit configured to operate in an active mode and a standby mode, the second stage circuit configured, in response to the output signal, to: switch from the standby mode to the active mode; monitor the supply voltage while in the active mode; confirm or disconfirm the possible change in limitations of the power source while in the active mode; trigger further electronic operations upon confirming the possible change in limitations; and return to the lower-power standby mode upon disconfirming the possible change in limitations.

2. The apparatus according to claim 1, wherein the first stage comprises one or more inputs for adjusting responsivity of the first stage, and wherein the second stage further comprises a supervisory module configured to: monitor for false detection events corresponding to disconfirming the possible change in limitations; and to adjust said one or more inputs for adjusting responsivity of the first stage in response to said monitored false detection events.

3. The apparatus according to claim 1, further comprising a filtering section operatively coupled to the input terminal and configured to provide a filtered signal indicative of the supply voltage to the analog electronics section, the first intermediate signal indicative of the supply voltage and the second intermediate signal indicative of the supply voltage generated based on the filtered signal indicative of the supply voltage.

4. The apparatus according to claim 1, wherein the comparator section comprises a first sub-section in parallel with a second sub-section, the first sub-section responsive to a reduction in the supply voltage, the second sub-section responsive to an increase in the supply voltage.

5. The apparatus according to claim 1, wherein the first stage circuit draws less than about 240 microamps on average.

6. An apparatus for use in adapting to time-varying limitations of a power source, the apparatus comprising:
   a.) an at least partially analog first stage circuit configured to monitor a supply voltage of the power source and to generate an interrupt signal in response to a predetermined amount of change in the monitored supply voltage, said change indicative of a possible change in limitations of the power source;
   b.) a second stage circuit operable in a lower-power standby mode and a higher-power active mode, the second stage circuit configured, in response to the interrupt signal, to: switch from the standby mode to the active mode; monitor the supply voltage while in the active mode; confirm or disconfirm the possible change in limitations of the power source while in the active mode; trigger further electronic operations upon confirming the possible change in limitations; and return to the lower-power standby mode upon disconfirming the possible change in limitations.

7. The apparatus according to claim 6, wherein the second stage circuit comprises a microprocessor used in monitoring the supply voltage and confirming or disconfirming the possible change in limitations, and wherein the microprocessor is used in performing said further electronic operations.

8. The apparatus according to claim 7, wherein said further electronic operations comprise one or more of: location monitoring, location reporting, wireless communication, data collection, data logging, and user interface operations.

9. A method for facilitating adapting to time-varying limitations of a power source, the method comprising:
   a.) receiving a supply voltage provided by the power source;
   b.) concurrently generating a first intermediate signal indicative of the supply voltage and a second intermediate signal indicative of the supply voltage using an analog electronics section, wherein the first intermediate signal responds at a first rate to variation in the supply voltage and the second intermediate signal responds at a second rate to variation in the supply voltage, the second rate different from the first rate;
   c.) using a comparator electronics section, comparing the first intermediate signal and the second intermediate signal and providing a change detect signal upon detecting at least a predetermined difference between the first intermediate signal and the second intermediate signal, said difference indicative of a possible change in limitations of the power source;
   d.) providing an output signal indicative of the change detect signal; and
   e.) in response to receipt of the output signal: switching a second stage circuit from a standby mode to an active mode; monitoring the supply voltage using the second stage circuit while in the active mode; confirming or disconfirming the possible change in limitations of the power source using the second stage circuit while in the active mode; triggering further electronic operations upon confirming the possible change in limitations; and returning to the lower-power standby mode upon disconfirming the possible change in limitations.

10. The method according to claim 9, further comprising monitoring for false detection events corresponding to disconfirming the possible change in limitations; and adjust one or both of the analog electronics section and the comparator electronics section in response to said monitored false detection events.

11. The method according to claim 9, further comprising providing a filtered signal indicative of the supply voltage to the analog electronics section, the first intermediate signal indicative of the supply voltage and the second intermediate signal indicative of the supply voltage generated based on the filtered signal indicative of the supply voltage.

12. A method for facilitating adapting to time-varying limitations of a power source, the method comprising:
   a.) monitoring a supply voltage of the power source and generating an interrupt signal in response to a predetermined amount of change in the monitored supply voltage, said change indicative of a possible change in limitations of the power source, wherein said monitoring and generating is performed using circuitry configured as at least partially analog;
   b.) in response to generation of the interrupt signal: switching a second stage circuit from a standby mode to an active mode; monitoring the supply voltage using the second stage circuit while in the active mode; confirming or disconfirming the possible change in limitations of the power source using the second stage circuit while in the active mode; triggering further electronic operations upon confirming the possible change in limitations; and returning the second stage circuit to the lower-power standby mode upon disconfirming the possible change in limitations.

13. The method according to claim 12, wherein the second stage circuit comprises a microprocessor used in monitoring the supply voltage and confirming or disconfirming the possible change in limitations, and wherein the microprocessor is used in performing said further electronic operations.

14. The method according to claim 13, wherein said further electronic operations comprise one or more of: location monitoring, location reporting, wireless communication, data collection, data logging, and user interface operations.

\* \* \* \* \*